United States Patent [19]

Malhi et al.

[11] Patent Number: 5,006,792
[45] Date of Patent: Apr. 9, 1991

[54] FLIP-CHIP TEST SOCKET ADAPTOR AND METHOD

[75] Inventors: Satwinder Malhi, Garland; Oh K. Kwon; Shivaling S. Mahant-Shetti, both of Richardson, all of Tex.

[73] Assignee: Texas Instruments Incorporated, Dallas, Tex.

[21] Appl. No.: 330,839

[22] Filed: Mar. 30, 1989

[51] Int. Cl.⁵ .......................... G01R 1/07; G01R 1/04
[52] U.S. Cl. .......................... 324/158 F; 324/72.5; 324/158 P; 439/68; 439/71; 357/67
[58] Field of Search .................................... 439/68-73, 439/525, 526; 357/67, 74, 88; 361/406, 409; 324/158 P, 158 F, 72.5

[56] References Cited

U.S. PATENT DOCUMENTS

| | | | |
|---|---|---|---|
| 3,700,788 | 10/1972 | Spinck | 439/71 |
| 4,433,886 | 2/1984 | Cassarly et al. | 439/71 |
| 4,564,251 | 1/1986 | Hansen et al. | 439/71 |
| 4,585,991 | 4/1986 | Reid et al. | |
| 4,686,468 | 8/1987 | Lee et al. | 439/68 |
| 4,739,257 | 4/1988 | Jenson et al. | 439/71 |
| 4,770,640 | 9/1988 | Walter | 439/69 |
| 4,791,464 | 12/1988 | Ipri et al. | 357/23.11 |
| 4,809,047 | 2/1989 | Temple | 357/67 |

*Primary Examiner*—Kenneth Wieder
*Assistant Examiner*—William J. Burns
*Attorney, Agent, or Firm*—W. James Brady, III; James T. Comfort; Melvin Sharp

[57] ABSTRACT

A test set socket adapter (20) comprises a substrate (28), a plurality of cantilever beams (32) and a package (30). A bare chip (22) may be inserted into and held by the test socket adapter (20) for insertion into a standard test socket. The cantilevers (32) are designed to deflect and compensate for variations in solder bumps (26) on the bare chip (22). The deflection of the cantilever beams (32) allows a positive contact between the solder bumps (26) and the cantilever beams for an AC and a burn-in test.

29 Claims, 2 Drawing Sheets

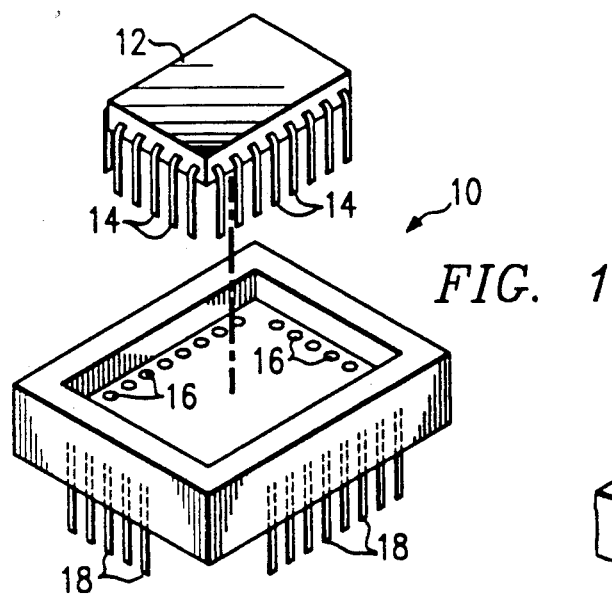
FIG. 1
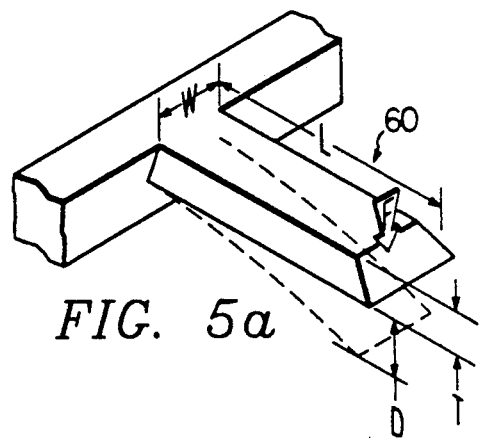
FIG. 5a
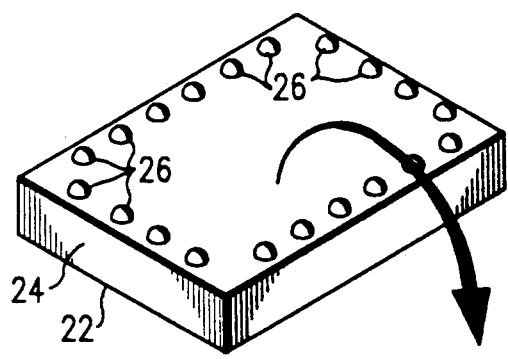
FIG. 2
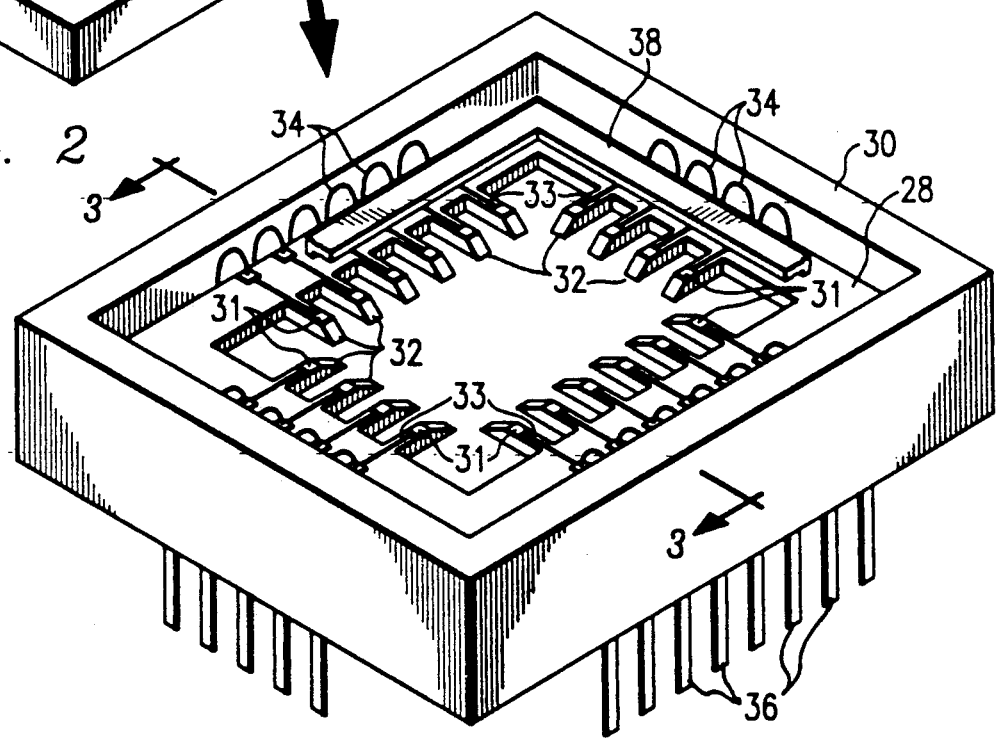

FLIP-CHIP TEST SOCKET ADAPTOR AND METHOD

TECHNICAL FIELD OF THE INVENTION

This invention relates in general to integrated circuit testing, and in particular to a flip-chip integrated circuit test socket adaptor and method.

BACKGROUND OF THE INVENTION

In standard integrated circuit chips, it is necessary to conduct alternating current (AC) and burn-in tests. These tests are normally conducted by packaging the chip into a physical package with external leads connected to the chip pads, and connecting the external leads to a test socket, which is then placed onto a board. The entire board, containing a plurality of chips and test sockets, may then be AC tested and tested at higher than normal operating temperatures and voltages (burn-in) to overstress the chips.

Flip-chip technology is a multi-chip technology in which the base chips are flip mounted on a thermally matched circuit board rather than using individual chip packages. A substrate such as a circuit board having solder bumps corresponding to the chip bumps is matched to the chip by "flipping" the chip over and onto the substrate. The chip and the substrate are then heated to reflow the solder and firmly attach the chip. In chip and wire multi-chip technology, each chip is die attached to an interconnect substrate and wire bonded to the substrate.

Due to the absence of external leads in chips intended for flip-chip technology or chip and wire technology (hereinafter both flip-chip and chip and wire technologies will be designated "bare chip"), the standard test and burn-in sockets cannot be used. The bare chips are not compatible with the test sockets used with standard packaged chips due to no external leads. Therefore, bare chips typically are not AC and burn-in tested prior to installation on a circuit board, which frequently results in nonfunctional boards due to bad bare chips. Thus, a need has arisen for a method and apparatus to allow bare chips to be adapted to a socket-type tester to allow AC and burn-in testing.

SUMMARY OF THE INVENTION

The present invention disclosed herein comprises a method and apparatus for adapting a bare chip for testing in a socket-type tester, which eliminates or substantially reduces problems associated with the testing of flip-chip and chip and wire multi-chip technologies. The present invention allows the insertion of the bare chip into a special test socket adaptor which may then be inserted into the socket tester.

In accordance with one aspect of the invention, a bare chip is inserted into a special socket for testing. The socket comprises a substrate constructed and arranged to receive and hold the bare chip. A plurality of pressure-sensitive contacts on the substrate are arranged to match the solder bump leads on the bare chip. A package holds the substrate and connects the pressure-sensitive contacts and the solder bumps on the bare chip in a standard socket tester configuration.

In a further aspect of the invention, the substrate comprises silicon of an n type conductivity. A first layer formed over the substrate is a p++ conductivity type silicon film, and a second silicon layer formed over the first layer is either a p or an n type conductivity layer. The p++ layer is doped up to $10^{20}$ atoms per cubic centimeter and is approximately 15 microns thick.

In a further aspect of the present invention, the second layer is patterned and etched to produce contacts for connection with the solder bumps. The p++ layer is selectively overetched to undercut the second layer and form cantilever beams therefrom. Thus, when a bare chip is placed over the substrate, the solder bumps will contact the cantilever beams, which will compensate for differences in the dimensions of the solder bumps. Thus, the substrate will be securely connected to all solder bumps on the bare chip for accurate testing thereof.

It is a technical advantage of the present invention that bare chips may be AC and burn-in tested prior to assembly on a circuit board. It is a further technical advantage that bare chips may be adapted for testing with a standard test socket.

BRIEF DESCRIPTION OF THE DRAWINGS

For a more complete understanding of the present invention and for further advantages thereof, reference is now made to the following Detailed Description, taken in conjunction with the accompanying Drawings, in which:

FIG. 1 is a perspective view of a test socket in accordance with the prior art;

FIG. 2 is a perspective view of a test socket adaptor constructed in accordance with the preferred embodiment of the present invention;

FIG. 5a is an isometric view of a cantilever with variable dimensions thereof.

DETAILED DESCRIPTION OF THE INVENTION

Figure 3:
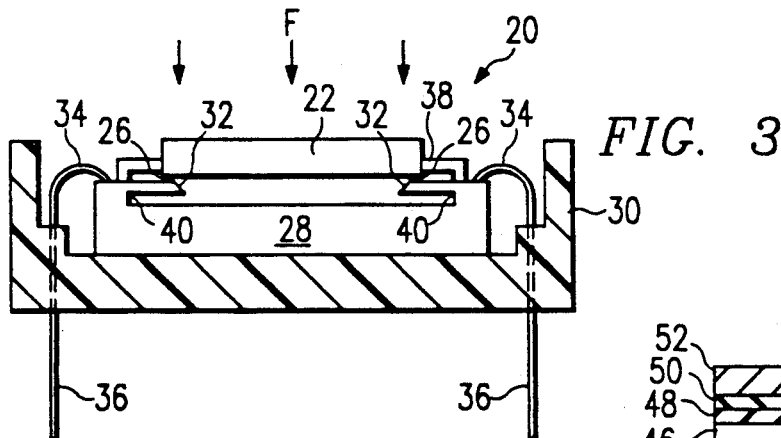
FIG. 3 is a cross-sectional view of the socket adaptor of FIG. 2.

Referring to FIG. 1, a test socket constructed in accordance with the prior art is generally identified by the reference numeral 10. The test socket 10 comprises a receptacle for receiving a semiconductor integrated circuit chip 12 having a plurality of rigid leads 14 extending therefrom. The leads 14 are interconnected to the circuits located within the chip 12 and are received by the socket receptacles 16 on the test socket 10. The receptacles 16 are interconnected to rigid leads 18 extending through the socket 10 to protrude therefrom.

The test socket 10 is designed to be plugged into a circuit board (not shown) with a plurality of other test sockets and chips. The board may then be used to run chips such as chip 12 through an alternating current (AC) test, as well as a burn-in test. The AC test checks the AC performance of the chip, and the burn-in test overstresses the chip in both voltage and temperature to eliminate defective chips.

Referring to FIG. 2, a test socket adaptor constructed in accordance with the preferred embodiment of the present invention is generally identified by the reference numeral 20. A flip-chip, as shown, or a chip and wire chip, both hereinafter referred to as bare chip 22, comprise a silicon substrate 24 upon which integrated circuits have been constructed. The integrated circuits are provided with bond pads (not shown) which have solder bumps 26 formed thereon rather than wire leads for interconnection to other devices. Without wire leads connected to a package lead-frame, it is not possible to plug the bare chip 22 into a conventional test socket to conduct the AC and burn-in tests. Additionally, since silicon substrates are not perfectly flat and solder bumps are not identical in size, it is difficult to make a simultaneous connection between all of the solder bumps 26 to perform tests prior to installation on a circuit board.

The test socket adaptor 20 of the present invention is constructed and arranged to provide compliant contacts to compensate for variances in the substrate 24 and the solder bumps 26 on the chip 22. The adaptor 20 comprises a substrate 28 and a package 30. The substrate 28 comprises a plurality of cantilever beams 32 arranged thereon to match with the solder bumps 26 on the chip 22. The beams 32 provide compliant contacts for the solder bumps 26 and are interconnected via pads 31, leads 33 and wires 34 to the package 30. The substrate 28 is preferably constructed of silicon to match the thermal expansion rate of the chip 22.

The package 30 comprises a sufficiently rigid material such as silicon to allow the socket adaptor 20 to be easily handled. It is important to ensure that the material from which the package 30 is made has a thermal expansion rate approximately equal to that of the substrate 28 and the chip 22 to prevent cracks therebetween during temperature cycling. The wires 34 pass through the package 30 and protrude therefrom to form rigid leads 36 which allow the socket adaptor 20 to then be inserted into a test socket (FIG. 1) for AC and burn-in testing on a circuit board. Also shown in FIG. 2 is a nest 38 constructed and arranged to provide matching alignment for the solder bumps 26 on the chip 22 with the cantilever beams 32.

Thus a bare chip 22 may be AC and burn-in tested using the socket adaptor 20 of the present invention. By aligning the chip 22 with the nest 38 and pressing the chip 22 into place, the adaptor 20 and the chip 22 may be plugged into a test socket and a circuit testing board. A plurality of bare chips 22 may be AC and burn-in tested along with a plurality of leaded chips with no modifications to the test equipment Therefore, a disadvantage of bare chip technology is overcome by the present invention.

Referring to FIG. 3, a cross-sectional view along the lines 3—3 of FIG. 2 is illustrated. The chip 22 has been placed in the socket adaptor 20 for testing. As can be seen in FIG. 3, the chip 22 is held in the adaptor 20 by the nest 38. Although not shown, it may be necessary to provide additional chip-retaining devices to hold the chip 22 in contact with the cantilever beams 32. The cantilever beams 32 will deflect about points 40, depending upon the variance between the solder bumps 26 and how much force F is applied to the chip 22.

Since the adaptor 20 will undergo various temperature changes, it is important to form the nest 38, the substrate 28 and the package 30 from thermally compatible materials. For example, if the substrate 28 comprises silicon, the nest 38 may be silicon and the package 30 may be ceramic. The nest 38, the substrate 28, and the package 30 are fixed together by any appropriate method such as by gluing with an epoxy.

Each cantilever beam 32 is electrically interconnected through the package 30 by wires 34, which form leads 36. The wires 34 are connected to the beams 32 by any appropriate wire-bonding technology, as is well known in the art. The test socket adaptor 20 may then be plugged into a test socket in accordance with the prior art and tested, along with a plurality of other chips.

The test socket adaptor 20 thus provides a standardization tool for use with bare chip technology. A bare chip having an uneven surface and various sized solder bumps may be inserted into the adaptor 20 for reliable circuit contact with the cantilever beams 32. The bare chip may then be AC and burn-in tested prior to installation on a circuit board.

Figure 3A:
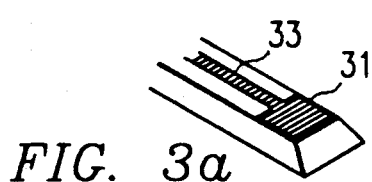
FIGS. 3a and 3b are perspective views of alternative constructions for contacts on the cantilever beam.
Figure 3B:
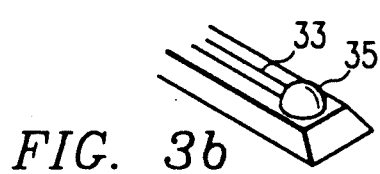

Referring to FIGS. 3a and 3b, alternative constructions are illustrated for the interconnection of a chip to the cantilever beam. The cantilever beam in FIG. 3a has a pad 31 and a lead 33 for use with a bare chip as previously described above. However, since it is possible to have bare chips with pads rather than solder bumps, the cantilever beams may be provided with solder bumps 35 and leads 33 (FIG. 3b) for connection thereto.

Figure 4A:
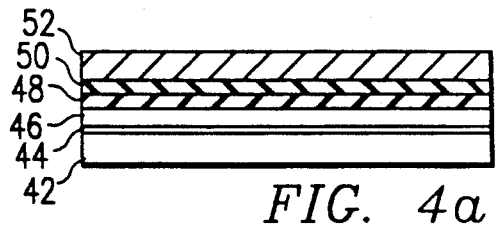
FIGS. 4a-4c are cross-sectional views of the method of constructing the cantilever beams in accordance with the preferred embodiment of the present invention.
Figure 4B:
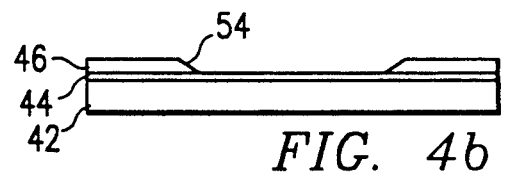
Figure 4C:

Referring to FIGS. 4a-c, cross-sectional views of the steps to fabricate the substrate 28 are shown. Referring first to FIG. 4a, a substrate 42 comprises, for example, an n type single crystal silicon. A first layer 44 comprising a p++ conductivity-type silicon is formed over the substrate 42. A second layer 46 which may comprise an n type conductivity silicon or a p type conductivity silicon is then formed over the first layer 44. An oxide layer 48 is grown over the second layer 46, followed by deposition of a thin nitride layer 50. Finally, a metallic layer 52 which may comprise, for example, titanium-tungsten and gold is formed over the nitride layer 50.

The metallic layer 52 is then patterned, using a standard photoresist process to match the desired pattern to form cantilever beams. An etch is performed (FIG. 4b), using an appropriate etchant, such as iodide, to form landing pads 31 (FIG. 2) to receive bumps and leads 33 (FIG. 2) from the landing pads 31 to the periphery for wire bonding.

An orientation-dependent etch using a wet etchant is then performed to transfer the pattern through the second layer 46 down to the first layer 44. The orientation-dependent etchant may comprise potassium hydroxide/propanol/water and is designed to stop when it reaches the first layer 44. Due to the nature of the silicon comprising the second layer 46, the etchant may produce angled edges 54 which may be fifty-four degrees on the ends of the cantilever beams 32.

An etchant designed to selectively attack the first layer 44 (for example, if layer 44 is a p++ conductivity type silicon, a 1:3:8 etchant comprising hydrochloric acid: nitric acid: and acetic acid having a selectivity of approximately 1,000 to 1 for p++ type conductivity silicon) is then used. The etch is continued until the first layer 44 is removed down to the substrate 42 and is overetched to undercut the second layer 46 to form the cantilever beams 32 (FIG. 4c). Due to the undercutting of the first layer 44 the second layer 46 is capable of deflecting under pressure until striking the substrate 44.

Dependent upon how much deflection is required for the cantilever 32, and how much force is to be applied to keep the chip in position, the design parameters for the cantilever beam may be chosen. Referring to FIG. 5a, an isometric representation of a cantilever beam is generally identified by the reference numeral 60. The cantilever 60 has a length L, a width W, and a thickness T. If the amount of force F and the amount of deflection D are known, the following equation may be solved for various lengths L, thicknesses T and widths W:

$$D = \frac{12}{3W + 1.414T} \times \frac{F}{E} \times \left(\frac{L}{T}\right)^3$$

E is Young's modulus for the material from which the cantilever beam is made, for example, silicon.

Figure 5B:
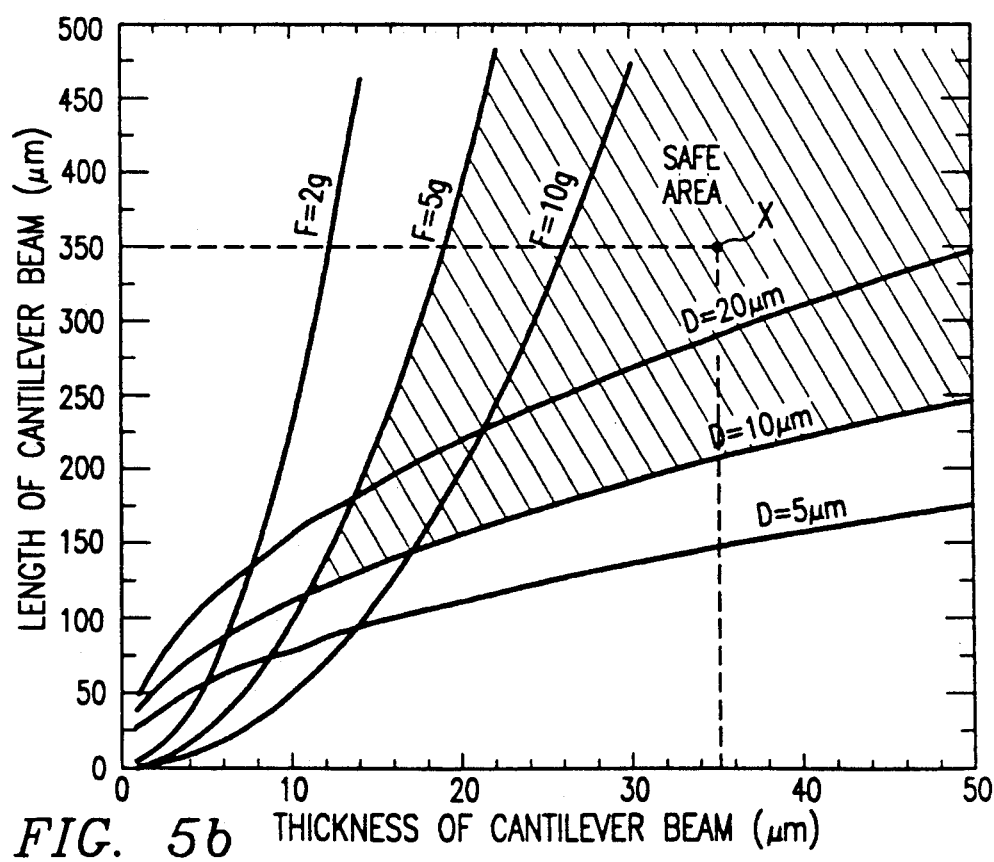
FIG. 5b is a graphical representation of the effects of various dimensions of the cantilever beam.

Referring to FIG. 5b, a graphical representation of a plot solving the equation above is shown. For example, for a known width W (if approximately ten microns of deflection D are required to compensate for variances in the chip being tested and five grams of force F will be used to hold the chip in place), it can be seen that a safe length L would be 350 microns and a safe thickness T would be 35 microns as indicated at a point X. Any dimensions for the length L and the thickness T that fall within the Safe Area would meet the requirements for testing a bare chip.

Thus, a cantilever beam may be designed with the proper length L, thickness T and width W for various required forces F and deflections D. Therefore, a bare chip may be inserted into the test socket adaptor 20 (FIG. 2), and variations in the surface of the chip, as well as the solder bumps, may be taken into consideration for an AC and burn-in test procedure. Thus, bare chips may be tested prior to their installation into a circuit board.

Many variations to the preferred embodiment may be designed and still fall within the disclosure of the present invention. For example, bare integrated circuit die may be tested by placing solder bumps on the end of the cantilevers (FIG. 3b). Additionally, other materials such as ceramic could be used to fabricate the adaptor, and the adaptor may be formed from techniques other than integrated circuit patterning and designing. The adaptor may be constructed by forming the various components separately and then affixing them to each other with an appropriate connector such as an adhesive.

Although the present invention has been described with respect to a specific preferred embodiment thereof, various changes and modifications may be suggested to one skilled in the art, and it is intended that the present invention encompass such changes and modifications as fall within the scope of the appended claims.

What is claimed is:

1. A socket adaptor for testing a bare integrated circuit chip having solder bump leads, comprising:
   a substrate constructed and arranged to receive and hold the chip;
   a plurality of pressure-sensitive contacts on said substrate matched to solder bump leads on the chip, said contacts comprising cantilever beams formed from a semiconductor material; and
   a package for holding said substrate such that the chip may be tested.

2. The socket adaptor of claim 1, wherein said substrate comprises:
   a silicon substrate having a first conductivity-type;
   a first silicon layer having a second conductivity-type formed over said substrate; and
   a second silicon layer formed over said first layer.

3. The socket adaptor of claim 2, wherein said substrate comprises an n type conductivity.

4. The socket adaptor of claim 2, wherein said first layer comprises a p++ type layer.

5. The socket adaptor of claim 4, wherein said p++ layer is doped up to $10^{20}$ atoms per cubic centimeter.

6. The socket adaptor of claim 2, wherein said first layer is 15 microns thick.

7. The socket adaptor of claim 2, wherein said second layer comprises an n type layer.

8. The socket adaptor of claim 2, wherein said second layer comprises a p type layer.

9. The socket adaptor of claim 2, wherein said contacts comprise cantilever beams formed from said second layer.

10. The socket adaptor of claim 1, wherein said package comprises:
    a container fixed to said substrate; and
    a conductor fixed to each of said contacts and extending through said container.

11. The socket adaptor of claim 1, further comprising a nest fixed to said substrate to help align said solder bump leads.

12. A socket adaptor for testing a bare integrated circuit chip, comprising:
    a substrate constructed to receive and hold the chip;
    a plurality of pressure-sensitive bumped contacts on said substrate matched to pads on the chip, said contacts comprising cantilever beams formed from a semiconductor material; and
    a package for holding said substrate such that the bare chip may be tested.

13. The adaptor of claim 12, wherein said substrate comprises:
    a silicon substrate having a first conductivity-type;
    a first silicon layer having a second conductivity-type formed over said substrate; and
    a second silicon layer formed over said first layer.

14. The adaptor of claim 13, wherein said substrate comprises an n type conductivity.

15. The adaptor of claim 13, wherein said first layer comprises a p++ type layer.

16. The adaptor of claim 15, wherein said p++ layer is doped up to $10^{20}$ atoms per cubic centimeter.

17. The adaptor of claim 13, wherein said first layer is 15 microns thick.

18. The adaptor of claim 13, wherein said second layer comprises an n type layer.

19. The adaptor of claim 13, wherein said second layer comprises a p type layer.

20. The adaptor of claim 13, wherein said contacts comprise cantilever beams formed from said second layer.

21. The adaptor of claim 12, wherein said package comprises:
    a container fixed to said substrate; and
    a conductor fixed to each of said contacts and extending through said container.

22. The adaptor of claim 12, further comprising a nest fixed to said substrate to help align said pads with said contacts.

23. A method for testing a bare chip, comprising the steps of:
    forming a test socket adaptor for receiving and holding the chip, said test socket adaptor including a plurality of pressure-sensitive contacts, said contacts comprising cantilever beams formed from a semiconductor material;

positioning the chip in said adaptor; and plugging said adaptor in a test socket to allow the chip to be tested.

24. The method of claim 23, wherein the step of forming a test socket adaptor comprises:

forming a substrate comprising said plurality of pressure-sensitive contacts to match electrical contacts on the bare chip;

fixing said substrate to a package, constructed and arranged to plug into said test socket; and electrically connecting said pressure-sensitive contacts to said package.

25. The method of claim 24, wherein the step of forming a substrate comprises:

forming a silicon substrate having a first conductivity-type;

forming a first silicon layer having a second conductivity-type over said substrate; and forming a second silicon layer over said first layer, said second layer comprising said contacts.

26. The method of claim 24, wherein the step of forming a substrate further comprises fixing a nest to said substrate to help align electrical contacts on the bare chip to said pressure-sensitive contacts.

27. The method of claim 24, wherein the step of positioning comprises:

aligning the electrical contacts on the bare chip with said pressure-sensitive contacts; and applying a force to the chip to deflect said pressure-sensitive contacts to provide an electrical connection to each of the electrical contacts on the bare chip.

28. The method of claim 24, wherein the electrical contacts on the bare chip are solder bump leads.

29. The method of claim 24, wherein the electrical contacts on the bare chip are pads.

* * * * *